United States Patent [19]
Goodwin-Johansson

[11] Patent Number: 5,001,082
[45] Date of Patent: Mar. 19, 1991

[54] SELF-ALIGNED SALICIDE PROCESS FOR FORMING SEMICONDUCTOR DEVICES AND DEVICES FORMED THEREBY

[75] Inventor: Scott H. Goodwin-Johansson, Pittsboro, N.C.

[73] Assignee: MCNC, Research Triangle Park, N.C.

[21] Appl. No.: 337,187

[22] Filed: Apr. 12, 1989

[51] Int. Cl.$^5$ .................. H01L 21/336; H01L 21/283
[52] U.S. Cl. ...................................... 437/200; 437/50;
437/178; 437/228; 437/41; 148/DIG. 19;
148/DIG. 116
[58] Field of Search ............... 437/200, 192, 193, 178,
437/228, 50, 245, 246, 41; 357/71; 148/DIG.
19, DIG. 147, DIG. 116

[56] References Cited

U.S. PATENT DOCUMENTS

| | | | |
|---|---|---|---|
| 3,777,364 | 12/1973 | Schinella et al. | 148/DIG. 147 |
| 4,359,816 | 11/1982 | Abbas et al. | 437/200 |
| 4,376,336 | 3/1983 | Endo et al. | 437/200 |
| 4,378,627 | 4/1983 | Jambotkar | 437/200 |
| 4,458,410 | 7/1984 | Sugaki et al. | 437/200 |
| 4,517,729 | 5/1985 | Batra | 437/200 |
| 4,641,417 | 2/1987 | McDavid | 437/200 |
| 4,873,204 | 10/1989 | Wong et al. | 437/200 |
| 4,873,205 | 10/1989 | Critchlow et al. | 437/200 |

OTHER PUBLICATIONS

Silicon Processing for the VLSI Era, by S. Wolf and R. N. Tauber, Lattice Press, 1986, pp. 397-399.
A New Device Interconnect Scheme for Sub-Micron VLSI, by D. C. Chen et al., IEDM 84, pp. 118-121.
Wong, S., et al., *IEEE Transactions on Electron Devices,* vol. ED-34, No. 3, Mar. 1987, pp. 587-592.
Choi, K., et al., *IBM Technical Disclosure Bulletin,* vol. 29, No. 3, Aug. 1986, pp. 1037-1038.

*Primary Examiner*—Brian E. Hearn
*Assistant Examiner*—T. N. Quach
*Attorney, Agent, or Firm*—Bell, Seltzer, Park & Gibson

[57] ABSTRACT

A self-aligned salicide process produces small dimensioned semiconductor devices, for example metal oxide semiconductor (MOS) devices. An electrode is formed on the face of a semiconductor substrate, the electrode having a top and a sidewall and an insulating coating on the sidewall. Then a silicon layer and a refractory metal layer are formed on the face, top and sidewall, with one of the layers being continuous, and the other layer having a break on the sidewall. In a preferred embodiment the silicon layer is directionally applied, to form thick portions on the face and top and thin portion on the sidewall. The thin portion on the sidewall is removed and a metal layer is uniformly deposited. The substrate is heated to convert at least part of the silicon and metal layers to silicide. The silicide layer on the face is planar and does not consume the substrate at the face, allowing shallow source and drain regions to be formed.

9 Claims, 4 Drawing Sheets

SELF-ALIGNED SALICIDE PROCESS FOR FORMING SEMICONDUCTOR DEVICES AND DEVICES FORMED THEREBY

FIELD OF THE INVENTION

This invention relates to a process for forming high density semiconductor devices and more particularly to a self-aligned silicide (or "salicide") process for forming small dimensioned self-aligned semiconductor devices, and the devices formed thereby.

BACKGROUND OF THE INVENTION

In order to form very large scale integration (VLSI) and ultra large scale integration (ULSI) chips, high density semiconductor devices, such as transistors, are required. Small, high density devices provide the added benefits of high speed and reduced parasitic capacitance and low resistance. However, shrinking device size places added demands on the alignment between the layers which form the device and device contacts, because alignment becomes more difficult as the device size shrinks.

The integrated circuit fabrication art has provided many "self-aligned" processes in an attempt to obtain small device size with small alignment tolerances. Self-aligned processes are described in U.S. Pat. No. 4,359,816 to Abbas et al. entitled Self-Aligned Metal Process For Field Effect Transistor Integrated Circuits; U.S. Pat. No. 4,378,627 to Jambotkar entitled Self-Aligned Metal Process For Field Effect Transistor Integrated Circuits Using Polycrystalline Silicon Gate Electrodes; and U.S. Pat. No. 4,517,729 to Batra entitled Method For Fabricating MOS Device With Self-Aligned Contacts.

One known process for fabricating high density devices with low parasitic resistance is the salicide or self-aligned silicide process, in which metal is deposited over a structure and reacted with the exposed silicon areas thereunder to form a silicide. In particular, to form Metal Oxide Semiconductor (MOS) field effect transistors, metal may be reacted with the exposed silicon areas of the source and drain as well as the exposed polysilicon areas of the gate to form a silicide. A gate sidewall oxide structure prevents the gate and source/drain areas from being electrically connected because of the lack of silicide formation on the oxide. Following silicide formation, a selective etch may remove the unreacted metal without attacking the silicide. The salicide process is generally described at pages 397-399 of Silicon Processing For The VLSI Era by S. Wolf and R. N. Tauber, Lattice Press, 1986. One particular example of a salicide process is illustrated in U.S. Pat. No. 4,641,417 to McDavid entitled Process For Making Molybdenum Gate and Titanium Silicide Contacted MOS Transistors In VLSI Semiconductor Devices, in which a molybdenum gate is protected from the salicide process by encapsulating with a cap oxide and sidewall oxide in order to seal the interface between the two oxides.

When practicing the salicide process, it is critical that the process itself does not degrade the favorable device characteristics which provide the high density structure. The salicide process can produce unacceptable changes in the device dimensions, which preclude formation of small, high density devices. Accordingly, much of the enhanced performance of the salicide process is lost. One example of this degradation is illustrated in a publication entitled A New Device Interconnect Scheme For Sub-Micron VLSI by D. C. Chen et al., IEDM 84, pages 118-121. In the Chen et al. publication a polysilicon gate is formed on the face of a silicon substrate. The polysilicon gate includes a sidewall oxide. Thin layers of refractory metal and amorphous silicon are then deposited sequentially in the same pumpdown. The amorphous silicon is then photolithographically defined and etched in a medium which has high selectivity to the underlying refractory metal. After resist strip the wafer is annealed, and the refractory metal reacts with the amorphous silicon as well as the monocrystalline silicon in the substrate to form a silicide. A selective wet etch removes the unreacted metal.

Unfortunately, the Chen et al. salicide process produces degraded devices in which the advantages of the salicide process are at least partially lost. Degraded devices are produced because the Chen et al. process requires a photoresist pattern which exposes the gate region. Due to alignment and lithographic tolerances, the photoresist cannot be patterned to abut the sidewall, so that an exposed region between the sidewall and photoresist contains refractory metal without amorphous silicon thereon. Then, during the silicide process, the exposed refractory metal between former edge the photoresist and the sidewall reacts with the silicon semiconductor substrate and consumes part of the silicon substrate. A multilevel silicide region is thereby formed in the source and drain regions, with part of the silicide being formed by consuming the amorphous silicon on the refractory metal and part of the silicide region being formed by consuming the underlying silicon substrate. However, by converting at least part of the underlying substrate to silicide, the characteristics of the substrate are altered. It is well known that in order to form small high density devices, very shallow device layers (e.g. source and drain regions) must be formed in the substrate. During the Chen salicide process, conversion of the substrate to salicide consumes at least a portion of the shallow device regions. In order to prevent consumption of a significant portion of the source/drain region, a deeper source/drain region must be provided. However, a deep source/drain region provides low density integrated circuit chips, thereby negating the advantage of the salicide process.

SUMMARY OF THE INVENTION

It is therefore an object of the present invention to provide an improved salicide process and devices formed thereby.

It is another object of the invention to provide an improved salicide process which does not degrade high density device characteristics.

It is yet another object of the invention to provide a salicide process which forms high density, low resistivity, low parasitic capacitance devices and interconnections therefor.

These and other objects are provided by a self-aligned salicide process for semiconductor devices in which an electrode is first formed on the face of a semiconductor substrate with the electrode having a top and a sidewall and an insulating coating on the sidewall. Then, a silicon layer and a conductor layer are formed on the face, top and sidewall, with one of the layers being continuous and the other layer having a break on the sidewall. In particular, a silicon layer and a conductor layer may be applied to the semiconductor substrate, with one of the silicon and conductor layers being directionally applied to the substrate so that a thick layer of the directionally applied material is formed on the face of the substrate and on the top of the electrode and a thin layer of the directionally applied material is formed on the sidewall. The thin layer on the sidewall is then removed. In a preferred embodiment, the silicon layer is first directionally applied to the substrate and then etched to remove the thin portion of the silicon layer on the sidewall. Refractory metal is then uniformly deposited. The silicide reaction is then allowed to take place by reacting at least part of the conductor and silicon layers on the face of the substrate to form a silicide.

A semiconductor device is thereby formed, according to the preferred embodiment of the invention, wherein a silicide layer on the face of the semiconductor substrate abuts against, or is in contact with, the insulating coating on the sidewall, and the silicide layer lies entirely on the face of the semiconductor substrate. Since the silicide layer lies entirely on the face of the substrate, there is no consumption of the substrate itself and therefore no consumption of the shallow device regions in the substrate. Accordingly, and in contrast with the Chen et al. process, the source/drain regions need not be made deep to accommodate substrate consumption. High density devices may be formed while retaining all of the desirable characteristics of the salicide process.

It will be understood by those having skill in the art that various methods may be employed for applying the silicon and conductor layers according to the present invention. In the preferred method, the silicon layer is directionally applied and the thin portion on the sidewall removed followed by a blanket deposition of the conductor. Alternatively, the conductor layer may be directionally applied and the thin conductor portion on the side wall removed followed by a blanket deposition of silicon Yet another option is the blanket deposition of the silicon layer followed by a directional application of the conductor layer and removal of the conductor layer on the side wall. Alternatively, a blanket deposition of conductor may first take place followed by a directional application on the silicon and a removal of the silicon on the side wall.

The present invention may be employed to form a self-aligned Metal Oxide Semiconductor (MOS) field effect transistor. A conventional MOS process may be employed to define the gate and oxide sidewalls, and field oxide regions for isolating transistors from one another Then, a thin film of silicon may be directionally deposited. Photoresist may then be applied and patterned to expose the silicon on the field oxide. In contrast with the Chen et al. process, the gate region is covered by the photoresist. The exposed silicon is removed on the field regions and the photoresist is removed. Source/drain regions may then be formed with the effective junction depth being very shallow. The silicon is then isotropically etched so that the silicon film on the sidewalls is separated. A metal film is blanket deposited and the salicide process is performed, thereby consuming the remaining silicon film. Accordingly, a self aligned MOS transistor is formed, in which the shallow junctions and all silicided regions are self-aligned while retaining the low resistivity and low capacitance characteristics of the salicide process.

DESCRIPTION OF THE PREFERRED EMBODIMENT

Figure 1A:
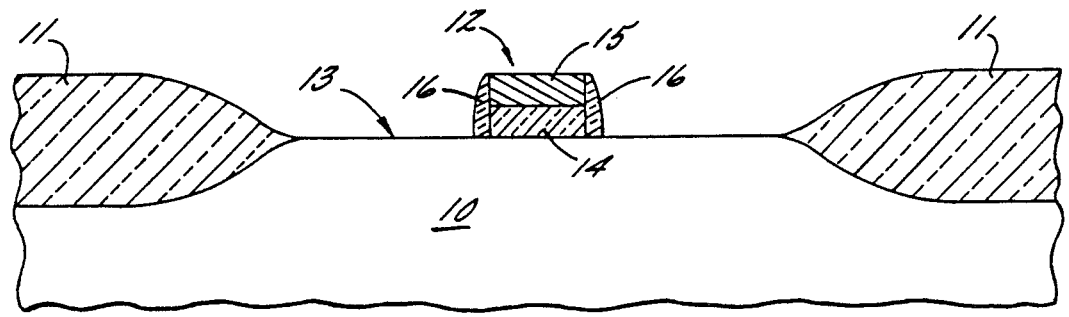
FIGS. 1A-1H are schematic cross sectional views of an integrated circuit chip showing a preferred embodiment of a self-aligned salicide process according to the present invention.

The present invention will now be described more fully hereinafter with reference to the accompanying drawings, in which a preferred embodiment of the invention is shown. This invention may, however, be embodied in many different forms and should not be construed as limited to the embodiment set forth herein; rather, applicant provides this embodiment so that this disclosure will be thorough and complete, and will fully convey the scope of the invention to those skilled in the art. Like numbers to like elements throughout. For greater clarity the thickness of the layers has been exaggerated.

Referring now to FIG. 1 a first embodiment of the salicide process of the present invention is illustrated. FIG. 1A illustrates a conventional integrated circuit structure, used for example to form MOS transistors on a semiconductor substrate 10. Field oxide regions 11 have been formed in the semiconductor substrate to isolate adjacent devices. An electrode 12, for example a MOS gate is also formed on the top face 13 semiconductor substrate 10. The electrode structure includes a gate oxide 14 and a gate conductor 15, typically polysilicon or metal, and an oxide coating 16 on the sidewall thereof. The electrode 12 may be formed using a conventional MOS process, for example by defining gate oxide 14 and gate conductor 15 using conventional photo-lithographic techniques and forming the oxide sidewall 16 using a conventional Chemical Vapor Deposition (CVD) process and a Reactive Ion Etch (RIE) or other directional etch back process to form sidewalls 16. Typically the gate oxide is silicon dioxide 150 to 300Å thick, gate electrode 15 is polysilicon 3000 to 5000Å thick, and sidewall coating 16 is silicon dioxide 1000 to 3000Å thick.

Figure 1B:
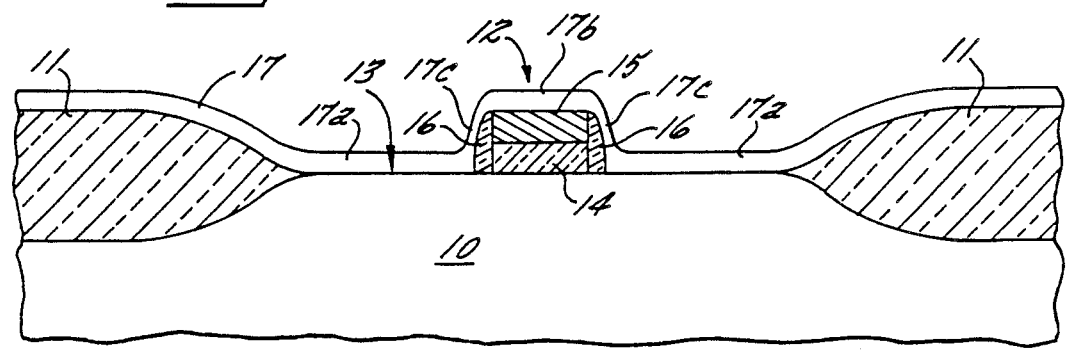

Referring now to FIG. 1B, a first layer 17 is directionally deposited, for example by evaporation. In a preferred embodiment, first layer 17 is amorphous or polycrystalline silicon. The directional evaporation of silicon layer 17 forms a thick silicon layer 17a (for example 500 to 1000Å thick) on face 13 of substrate 10 and on the top 17b of the electrode 12, and a thin silicon layer 17c (for example 50 to 200Å thick) on the sidewall 16.

Figure 1C:
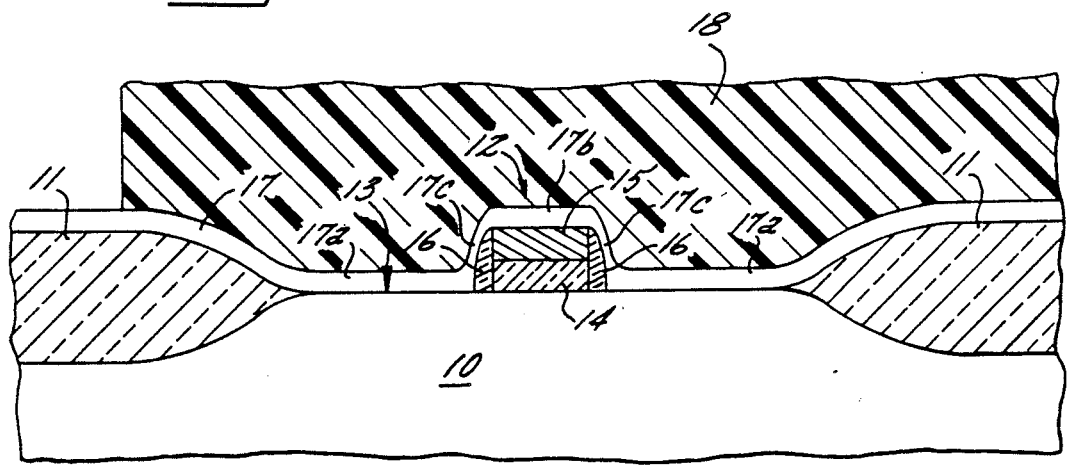
Figure 1D:
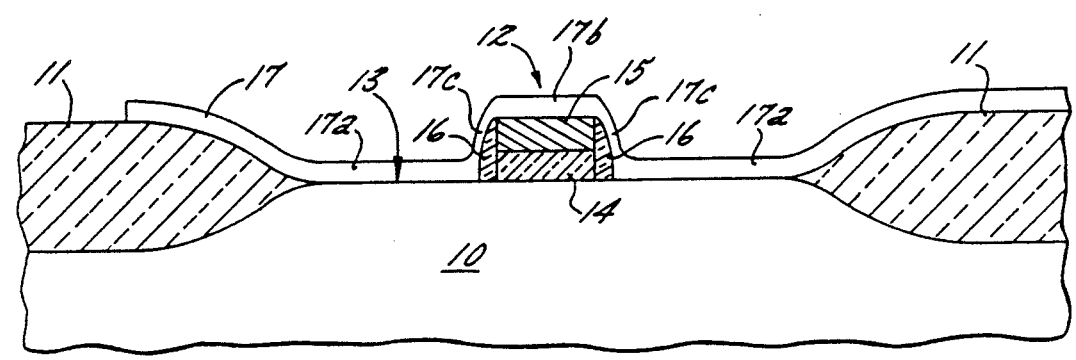

Referring now to FIG. 1C photoresist 18 is applied and patterned on field oxide 11 to alloW for local interconnect and movement of the device contact onto the field oxide. However, in contrast with the process disclosed in the Chen et al. patent, the photoresist of FIG. 1C completely covers electrode 12. Referring now to FIG. 1D that portion of silicon layer 17 over field oxide 11 is removed and the photoresist 18 is removed.

Figure 1E:
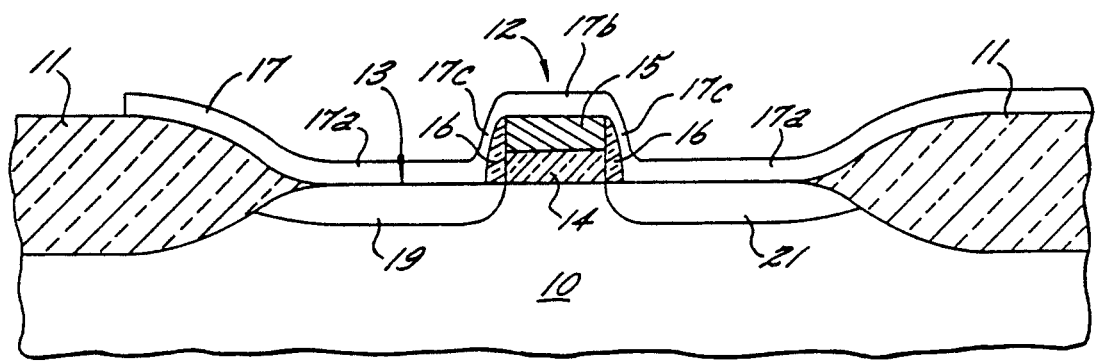

Referring now to FIG. 1E, source and drain regions 19 and 21 respectfully, may be formed through silicon region 17a. It will be understood by those having skill in art that silicon region 17a permits a shallow implant to be performed thereby forming shallow source and drain regions 19 and 21 to thereby enhance the device characteristics. Source and drain regions 19 and 21 may be 1000 to 3000Å thick. It will also be understood by those having skill in the art that source and drain regions 19 and 21 respectively may be formed at other points in the process of FIG. 1 or after completion of the process of FIG. 1.

Figure 1F:
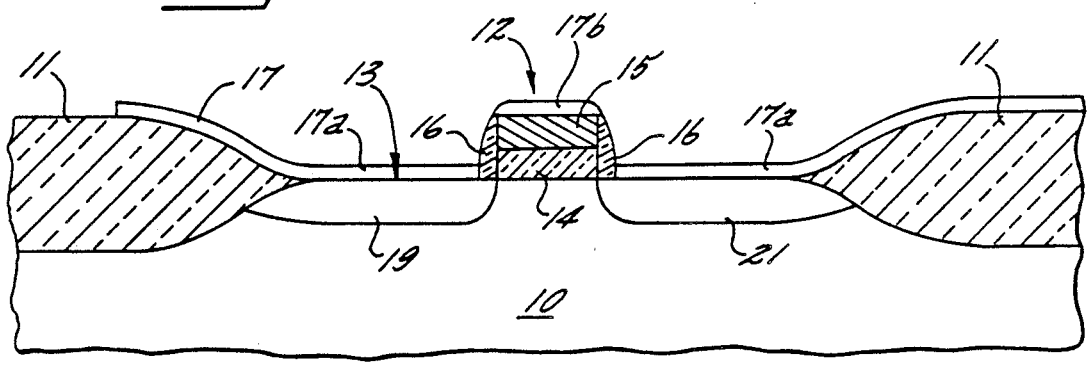

Referring now to FIG. 1F first layer 17 is isotropically etched, so as to remove that portion 17c of layer 17 on the sidewalls, and form a break in layer 17 at the sidewall 16. If layer 17 is silicon the layer may be oxidized sufficiently to convert the silicon in layer 17c into silicon dioxide, to thereby form a break in layer 17 on sidewall 16.

Figure 1G:
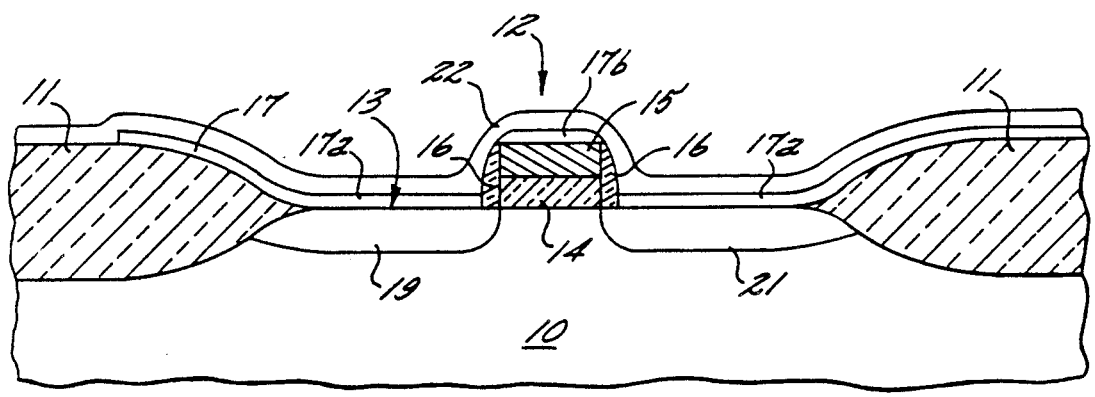

Referring now to FIG. 1G a second layer 22, 300 to 700Å thick, is then deposited on substrate 10. In the preferred embodiment, when first layer 17 is silicon second layer 22 is a refractory metal, for example tungsten, titanium or molybdenum, or any other metal which can react with silicon to form a silicide using the silicide process.

Figure 1H:
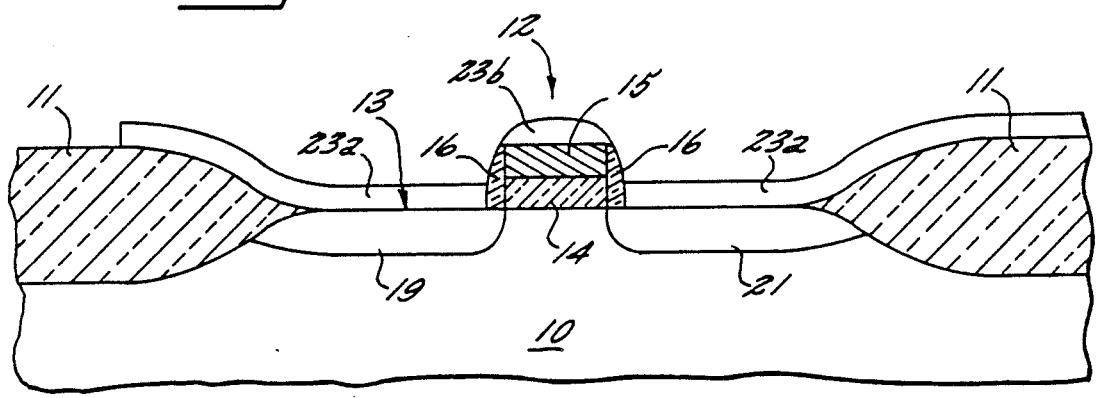

Referring now to FIG. 1H, first layer 17 and second layer 22 are reacted using a conventional salicide process, for example by heating at 650° C. for 20 minutes to convert at least part of first layer 17 and second layer 22 into silicide. FIG. 1H illustrates all of layer 17 and 22 being converted into silicide layer 23. As illustrated in FIG. 1H, source and drain portions 23a abut against oxide sidewall 16 and lie entirely on the top face 13 of semiconductor substrate 10. Shallow, uniform source and drain junctions 19 and 21 are thereby provided. Any unreacted metal may be removed if necessary using conventional techniques, for example, by etching in sulfuric acid ($H_2SO_4$).

It will be understood by those having skill in the art that in the preferred embodiment layer 17 is silicon while layer 22 is a refractory metal. This ensures that no consumption of drain and source regions 19 and 21 occurs, and the removal of unreacted metal from the silicide is facilitated. However, it will be understood that in a second embodiment layer 17 may be metal and layer 22 may be silicon In this embodiment some of gate and source regions 21 may be consumed during the silicide process, as metal layer 17 reacts with silicon substrate 10 below and silicon layer 22 above to form a silicide Planar salicide regions 23a will still be formed, with less substrate consumption than the Chen et al. process because the silicon layer 22 at least partially contributes to the silicide reaction. Any unreacted silicon may be converted to silicon dioxide or removed, for example by etching in a mixture of hydrofluoric, nitric and acetic acid.

Referring now to FIG. 2 an alternate embodiment of the present invention is illustrated. The embodiment of FIG. 2 differs from the embodiment of FIG. 1 in that the first layer is not removed from the sidewall. Rather, the first layer is uniformly formed and the second layer is removed from the sidewall. The process of FIG. 2 begins with the same structure shown in FIG. 1A (see FIG. 2A). Then, referring to FIG. 2B, first layer 27 is uniformly applied to substrate 10. First layer 27 is preferably amorphous or polycrystalline silicon. As shown in FIGS. 2C and 2D, first layer 27 may be patterned as was described in connection FIGS. 1C and 1D. The source and drain regions may also be formed as was described in FIG. 1E.

Figure 2A:
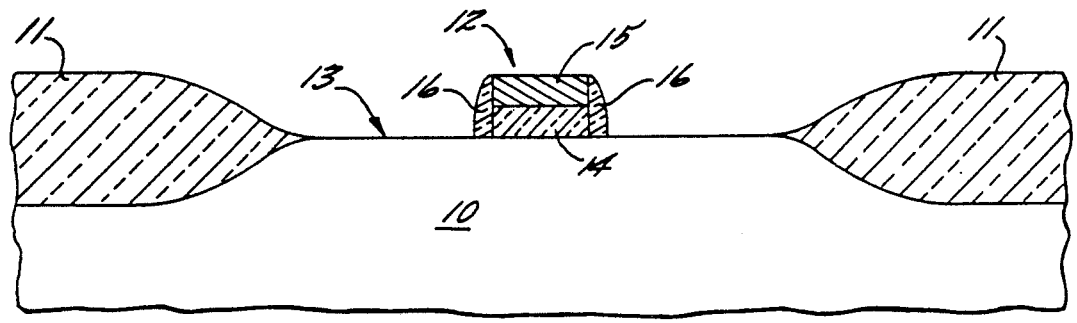
FIGS. 2A-2H are schematic cross sectional views of an integrated circuit chip showing an alternate embodiment of a self-aligned salicide process according to the present invention.
Figure 2B:
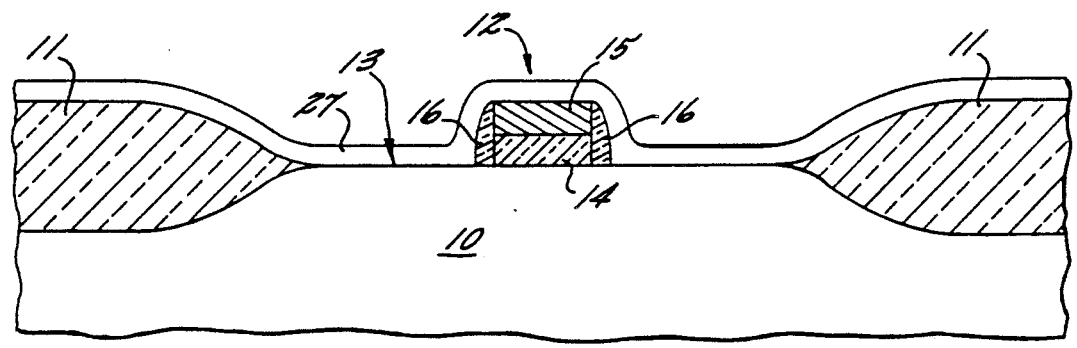
Figure 2C:
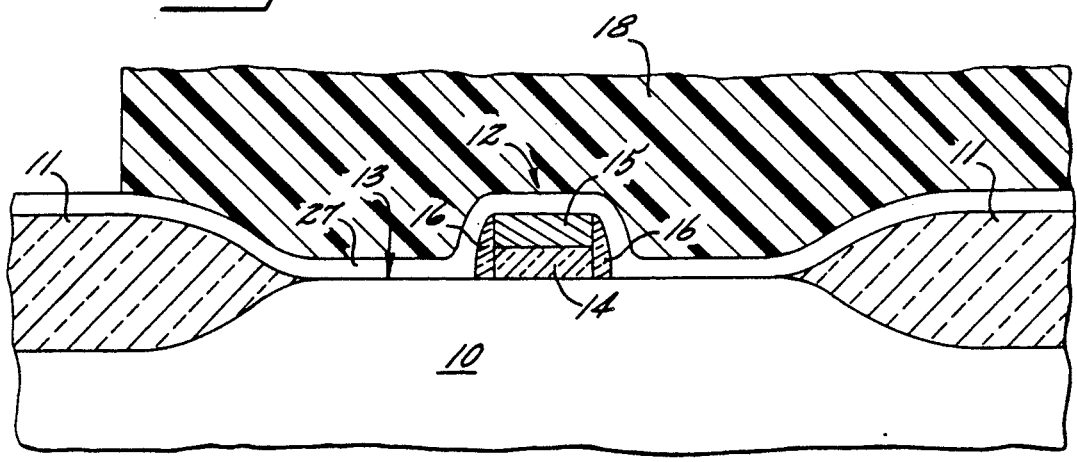
Figure 2D:
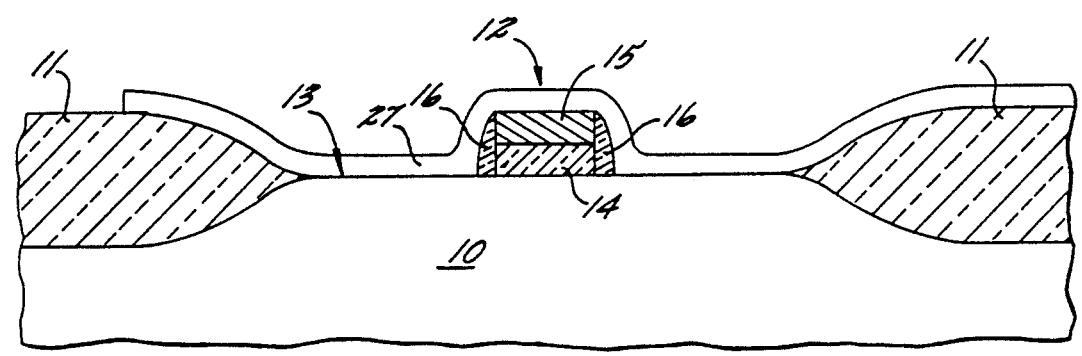
Figure 2E:
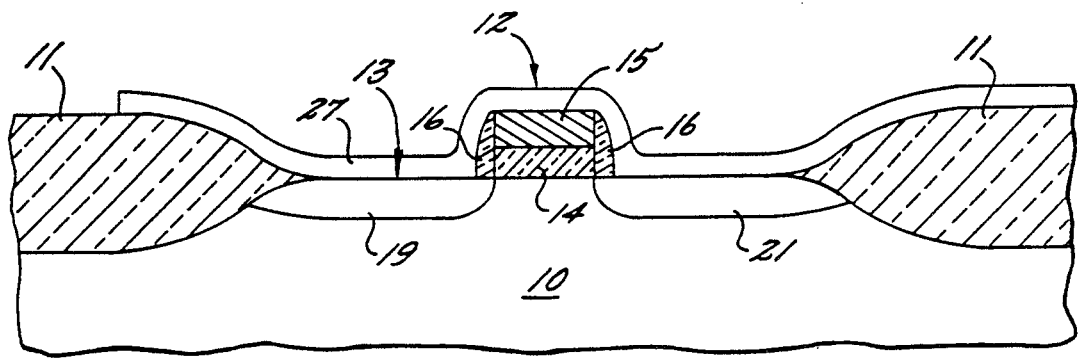
Figure 2F:
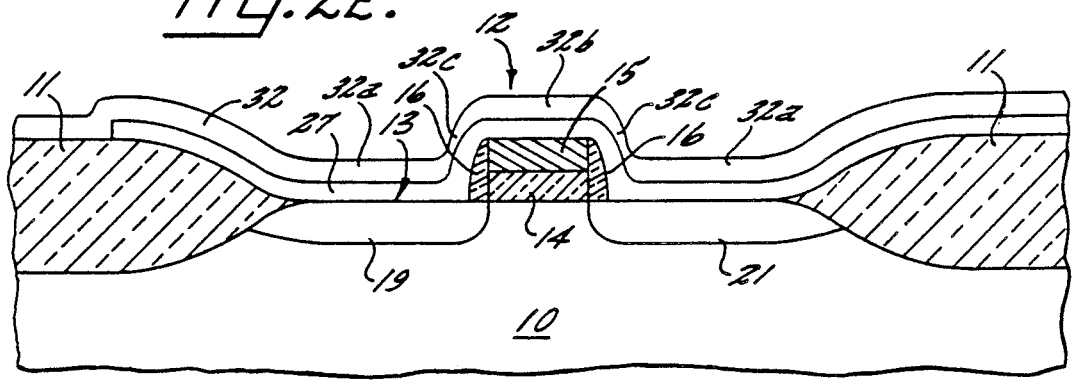
Figure 2G:
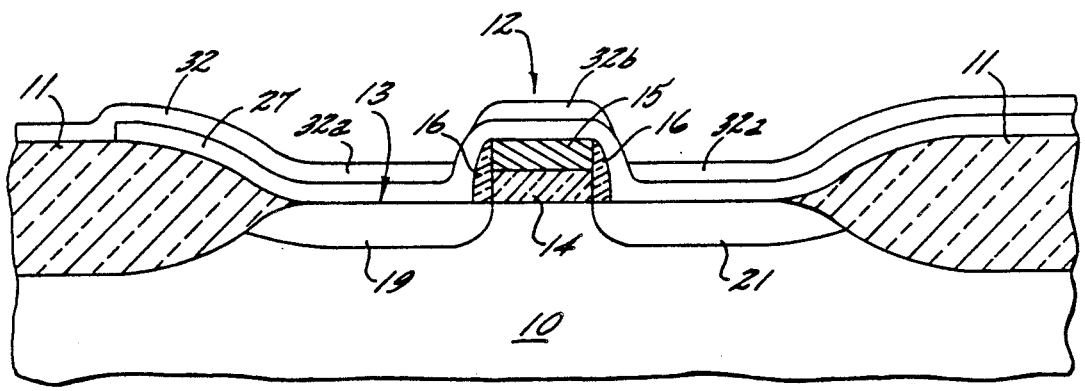
Figure 2H:
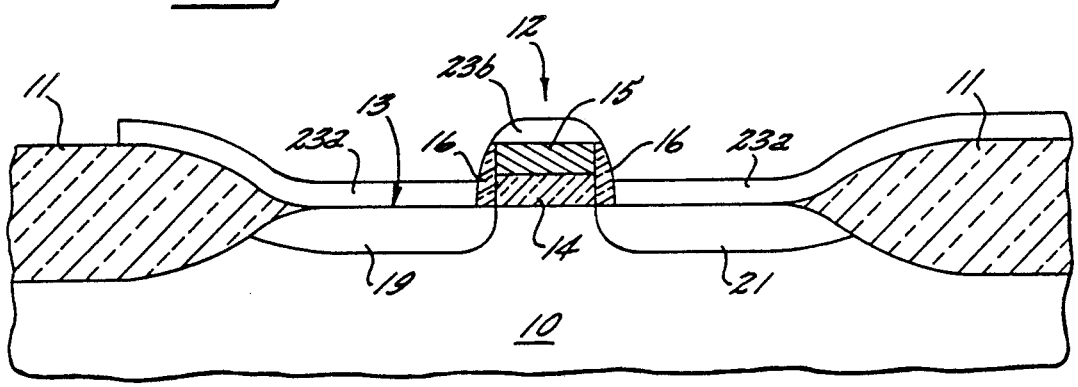

Referring now to FIG. 2F, second layer 32 may be directionally applied to form a thick portion 32a on the face 13 of substrate 10 and a thick portion 32b on top of electrode 12 and a thin layer 32c on the sidewall 16. Second layer 32 is preferably a refractory metal layer. Then, referring to FIG. 2G a portion of second layer 32c on sidewall 16 is isotropically removed to thereby create a break in layer 32. Then, referring to FIG. 2H the salicide process is performed as was described in connection with FIG. 1H, to form silicide regions 23a and 23b. Like the preferred process of FIG. 1, the preferred process of FIG. 2 will not consume substrate lo in the source and drain regions 19 and 21, thereby allowing shallow device regions to be performed. Silicide regions 23a lie on the face 13 of substrate 10. In contrast with the preferred process of FIG. 1, unreacted silicon must be removed from sidewall 16, for example, by converting to silicon dioxide or etching in a mixture of hydrofluoric, nitric and acetic acid.

An alternate embodiment for the process of FIG. 2 may employ first layer 27 of refractory metal and second layer 32 of silicon Like the alternative process of FIG. 1, some substrate consumption may occur.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a semiconductor device comprising the steps of:
    forming a field oxide region on a face of a semiconductor substrate, said field oxide region surrounding a predetermined area on said face, for isolating said predetermined area;
    forming an electrode on said predetermined area, said electrode having a top and a sidewall, and an insulating coating on said sidewall;
    forming a silicon layer on said field oxide region, on said predetermined area, on said top and on said sidewall, said silicon layer having a break on said sidewall;
    forming a continuous conductor layer on said silicon layer over said field oxide region, over said predetermined area, over said top and over said sidewall; and
    reacting at least part of said silicon layer and at least part of said conductor layer to form silicide on said predetermined area, on said top and on said field oxide region.

2. The method of claim 1 wherein said step of forming a silicon layer comprises the steps of:
    directionally applying said silicon layer to said semiconductor substrate, to thereby form a thick silicon layer on said field oxide region, on said predetermined area and on said top, and a thin silicon layer on said sidewall; and,
    removing said thin silicon layer on said sidewall.

3. The method of claim wherein the step of removing said thin silicon layer on said sidewall comprises the step of converting said thin silicon layer on said sidewall to silicon dioxide.

4. A method of forming a semiconductor device comprising the steps of:
    forming a field oxide region on a face of a semiconductor substrate, said field oxide region surrounding a predetermined area on said face, for isolating said predetermined area;

forming an electrode on said predetermined area, said electrode having a top and a sidewall, and an insulating coating on said sidewall;

forming a continuous silicon layer on said field oxide region, on said predetermined area, on said top and on said sidewall;

forming a conductor layer on said silicon layer over said field oxide region, over said predetermined area, over said top and over said sidewall, said conductor layer having a break on said sidewall; and reacting at least part of said silicon layer and at least part of said conductor layer to form silicide on said predetermined area, on said top and on said field oxide region.

5. The method of claim 4 wherein said step of forming a conductor layer comprises the steps of:

directionally applying said conductor layer to said silicon layer, to thereby form a thick conductor layer on said silicon layer over said field oxide region, over said predetermined area and over said top, and a thin conductor layer on said silicon layer over said sidewall; and, removing said thin conductor layer on said silicon layer over said sidewall.

6. The method of claims 1 and 4 wherein the step of forming an electrode comprises the step of forming a field effect transistor gate electrode on said predetermined area, said gate electrode having a top and a sidewall and an insulating coating on said sidewall; and wherein said method further comprises the step of forming field effect transistor source and drain regions in said predetermined area, to thereby form a self-aligned field effect transistor.

7. The method of claim 6 wherein the step of forming field effect transistor source and drain regions in said face of said semiconductor substrate is performed prior to the step of forming said conductor layer.

8. The method of claims 1 and 4 wherein said conductor layer comprises a refractory metal layer and wherein said silicon layer is selected from the group consisting of amorphous silicon and polycrystalline silicon.

9. The method of claims 1 and 4 wherein said reacting step comprises the step of heating said semiconductor substrate at about 650° C. for about 20 minutes.

* * * * *

UNITED STATES PATENT AND TRADEMARK OFFICE
CERTIFICATE OF CORRECTION

PATENT NO. : 5,001,082  Page 1 of 2
DATED : March 19, 1991
INVENTOR(S) : Goodwin-Johansson It is certified that error appears in the above-identified patent and that said Letters Patent is hereby corrected as shown below:

ABSTRACT: Line 11, after "and" (second occurrence) please insert --a--.

Column 1, lines 45 and 46, please delete "source/-drain" and substitute --source/drain-- therefor.

Column 3, line 53, after "another" please insert --.--.

Column 4, line 58, please delete "alloW" and substitute --allow-- therefor.

Column 5, line 12, after "silicon" please insert --,--.

Column 5, line 44, after "silicon" please insert --.--.

Column 5, line 48, after "silicide" please insert --.--.

Column 6, line 12, after please delete "lo" and substitute --10-- therefor.

Column 6, line 22, after "silicon" please insert --.--.

UNITED STATES PATENT AND TRADEMARK OFFICE
CERTIFICATE OF CORRECTION

PATENT NO. : 5,001,082
DATED : March 19, 1991
INVENTOR(S) : Goodwin-Johansson

It is certified that error appears in the above-indentified patent and that said Letters Patent is hereby corrected as shown below:

Column 6, line 61, after "claim" please insert --18--.

Signed and Sealed this

Twenty-eighth Day of September, 1993

*Attest:*

BRUCE LEHMAN

*Attesting Officer*  *Commissioner of Patents and Trademarks*